(12) United States Patent
Shim et al.

(10) Patent No.: US 12,074,047 B2
(45) Date of Patent: Aug. 27, 2024

(54) DISPLAY DEVICE MANUFACTURING METHOD, AND SUBSTRATE FOR MANUFACTURE OF DISPLAY DEVICE

(71) Applicant: LG ELECTRONICS INC., Seoul (KR)

(72) Inventors: Bongchu Shim, Seoul (KR); Jinsung Kim, Seoul (KR); Hyunho Lee, Seoul (KR); Gunho Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 435 days.

(21) Appl. No.: 17/618,108

(22) PCT Filed: Feb. 11, 2020

(86) PCT No.: PCT/KR2020/001881
§ 371 (c)(1),
(2) Date: Dec. 10, 2021

(87) PCT Pub. No.: WO2020/262792
PCT Pub. Date: Dec. 30, 2020

(65) Prior Publication Data
US 2022/0328335 A1 Oct. 13, 2022

(30) Foreign Application Priority Data

Jun. 28, 2019 (KR) .......................... 10-2019-0078220

(51) Int. Cl.
*H01L 21/68* (2006.01)
*H01L 21/683* (2006.01)
*H01L 25/075* (2006.01)

(52) U.S. Cl.
CPC .......... *H01L 21/68* (2013.01); *H01L 21/6833* (2013.01); *H01L 25/0753* (2013.01)

(58) Field of Classification Search
CPC ... H01L 21/68; H01L 2224/301–30183; H01L 2224/141–14183;
(Continued)

(56) References Cited

U.S. PATENT DOCUMENTS

| 7,251,882 B2 | 8/2007 | Ricks et al. |
| 2017/0104009 A1 | 4/2017 | Peng et al. |
| 2017/0338372 A1 | 11/2017 | Teraguchi et al. |

FOREIGN PATENT DOCUMENTS

| JP | 2008-512253 A | 4/2008 |
| KR | 10-2018-0089771 A | 8/2018 |
| KR | 10-2018-0130845 A | 12/2018 |

OTHER PUBLICATIONS

International Search Report, issued in PCT/KR2020/001881, PCT/ISA/210, dated May 20, 2020.

*Primary Examiner* — Amar Movva
(74) *Attorney, Agent, or Firm* — Birch, Stewart, Kolasch & Birch, LLP

(57) ABSTRACT

Discussed is an assembly board for use in a method for manufacturing a display device which allows semiconductor light emitting diodes to be seated at preset positions on the assembly board using an electric field and a magnetic field, the assembly board including a base portion; a plurality of assembly electrodes extending in one direction and disposed on the base portion; a dielectric layer stacked on the base portion to cover the plurality of assembly electrodes; and barrier ribs having a plurality of grooves for guiding the semiconductor light emitting diodes to the preset positions and formed on the base portion, wherein each of the plurality of grooves is arranged to overlap only one assembly electrode of the plurality of assembly electrodes such that an electric field is formed between the plurality of grooves adjacent to each other.

20 Claims, 26 Drawing Sheets

(58) Field of Classification Search
CPC .......... H01L 2224/411–4118; H01L 2224/221; H01L 33/00–648
See application file for complete search history.

[FIG. 1]
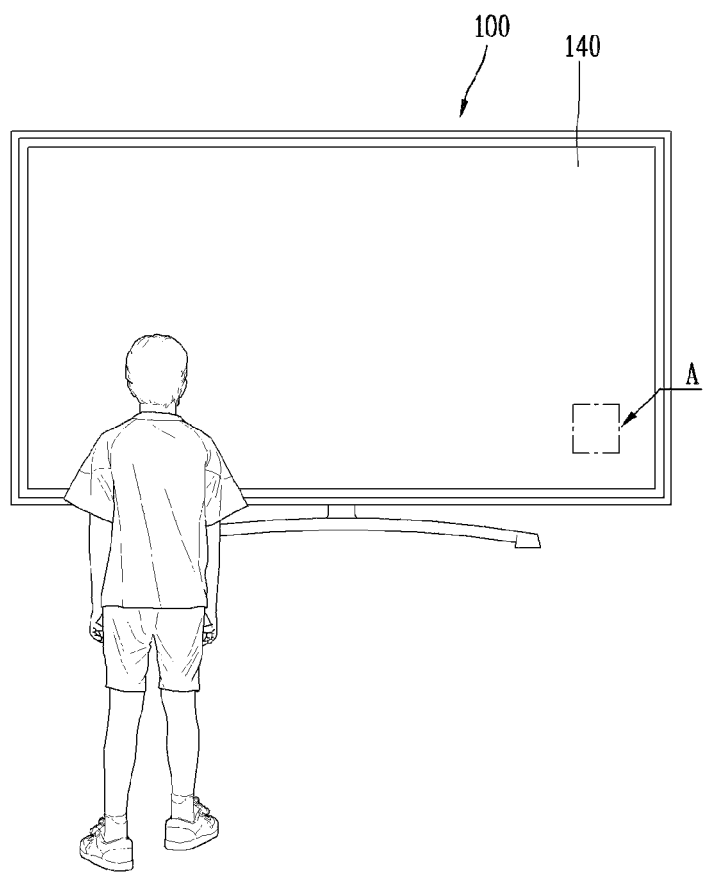

[FIG. 2]
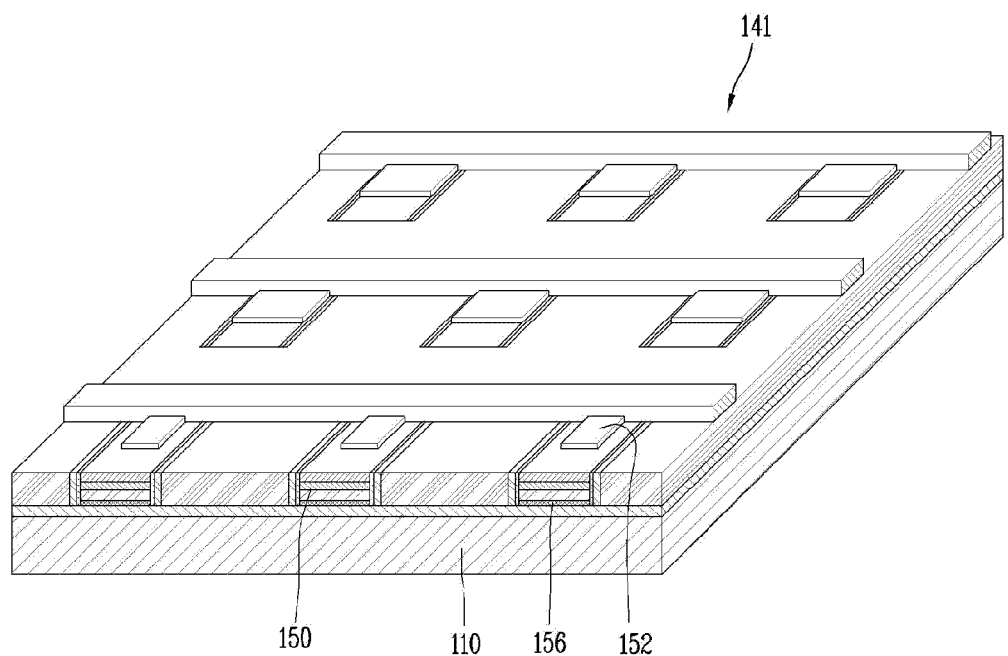

[FIG. 3]
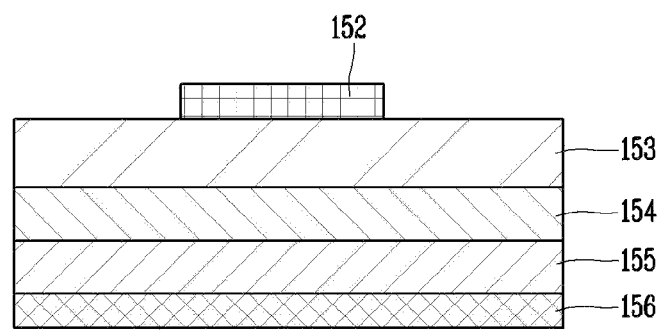

[FIG. 4]
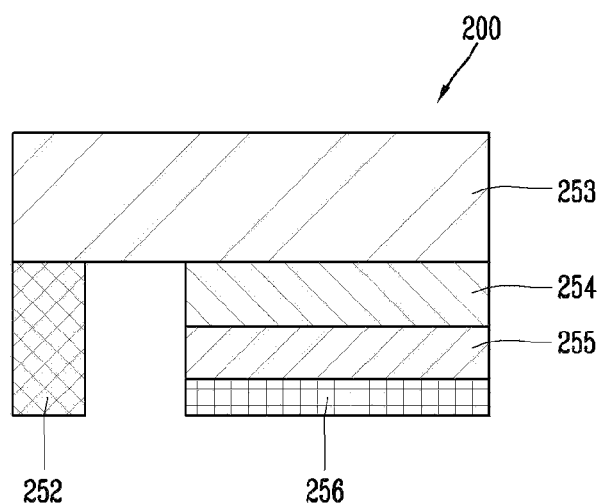

[FIG. 5a]
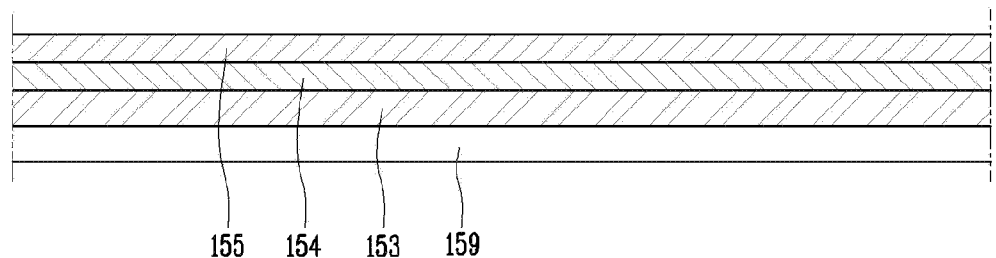
155 154 153 159

[FIG. 5b]
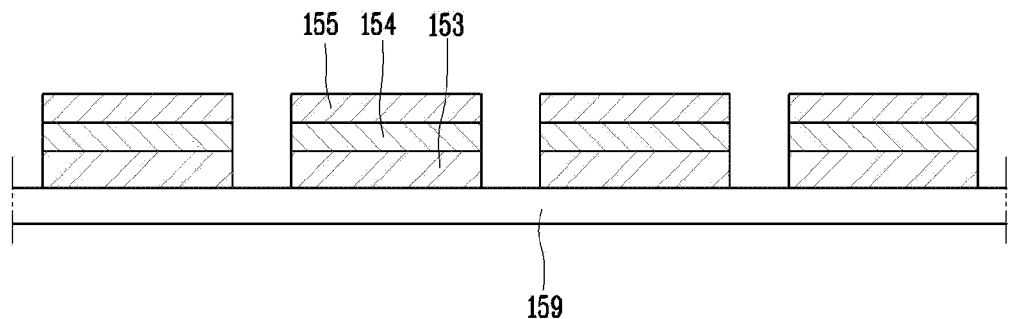

[FIG. 5c]
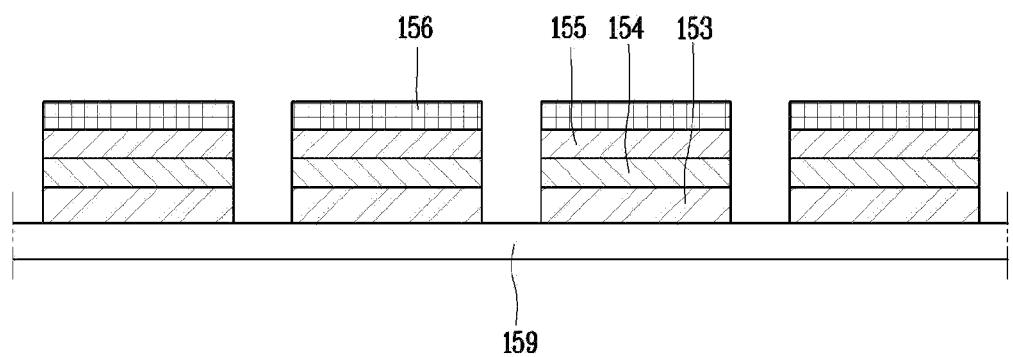

[FIG. 5d]
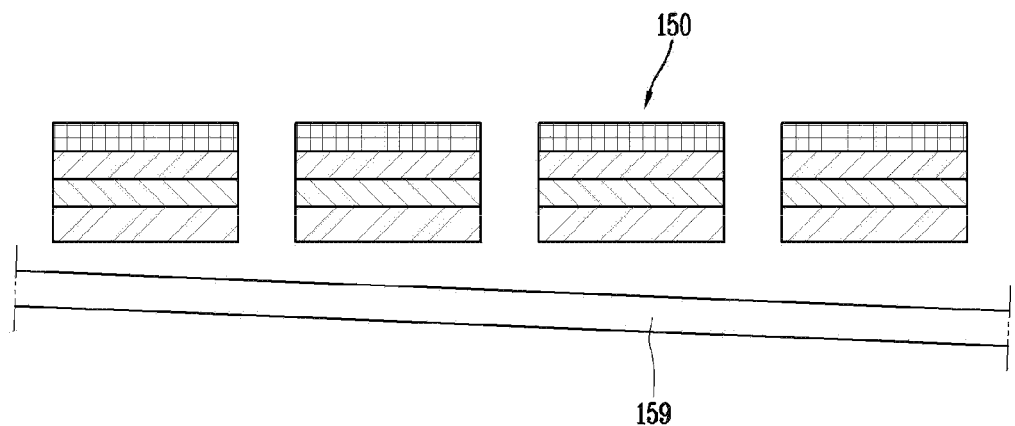

[FIG. 5e]
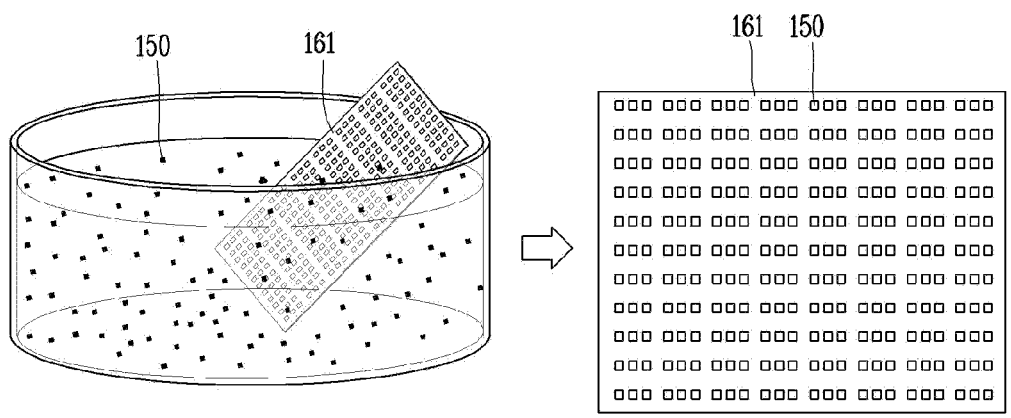

[FIG. 6]
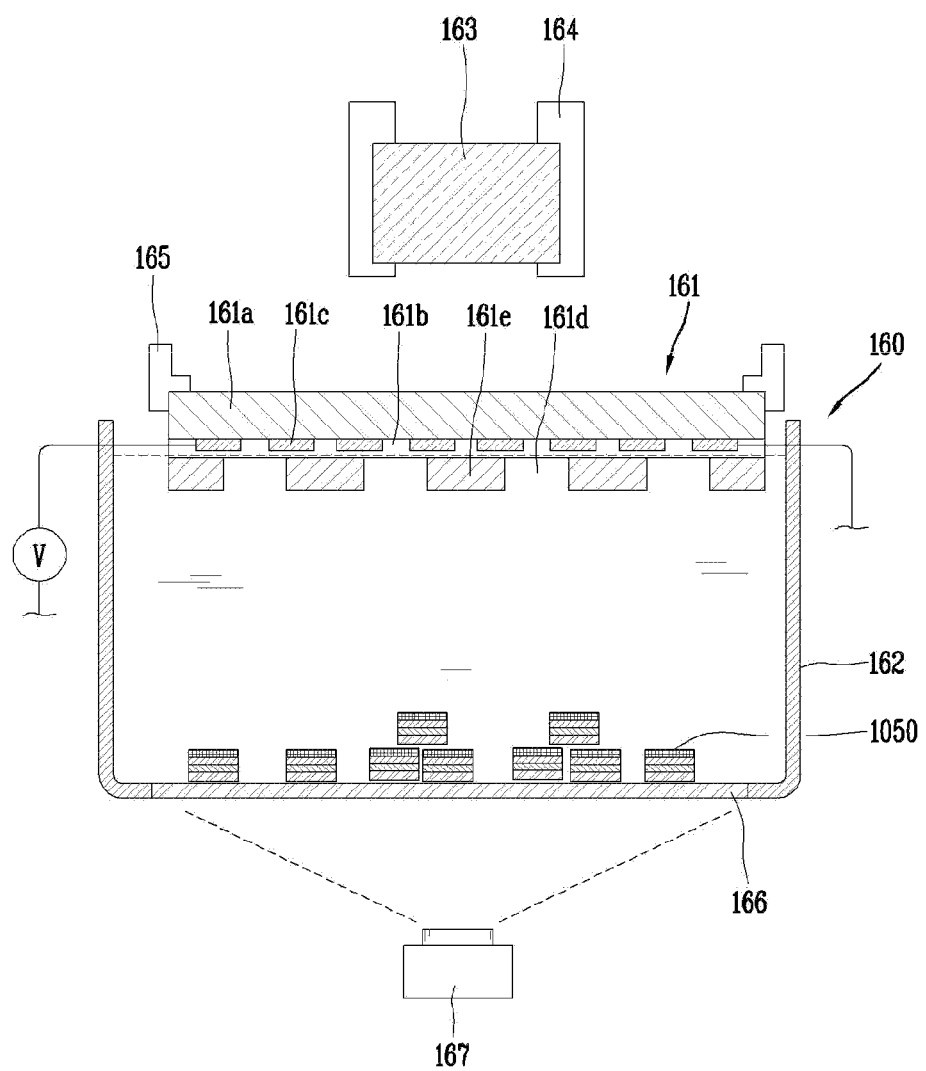

[FIG. 7]
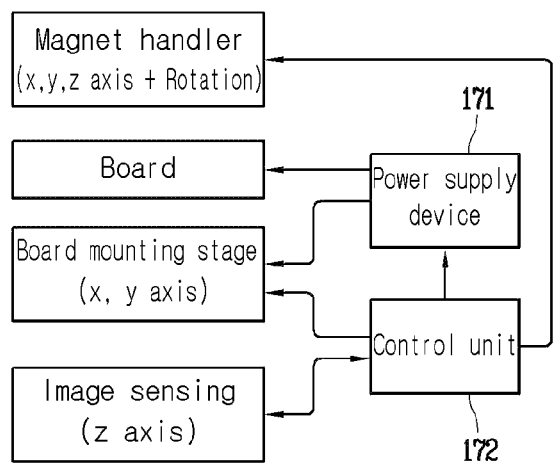

[FIG. 8a]
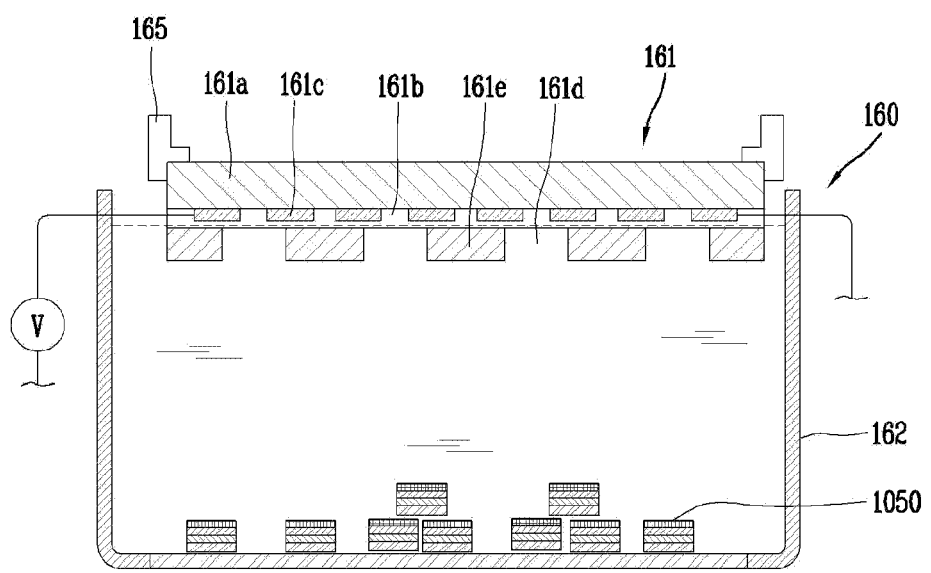

[FIG. 8b]
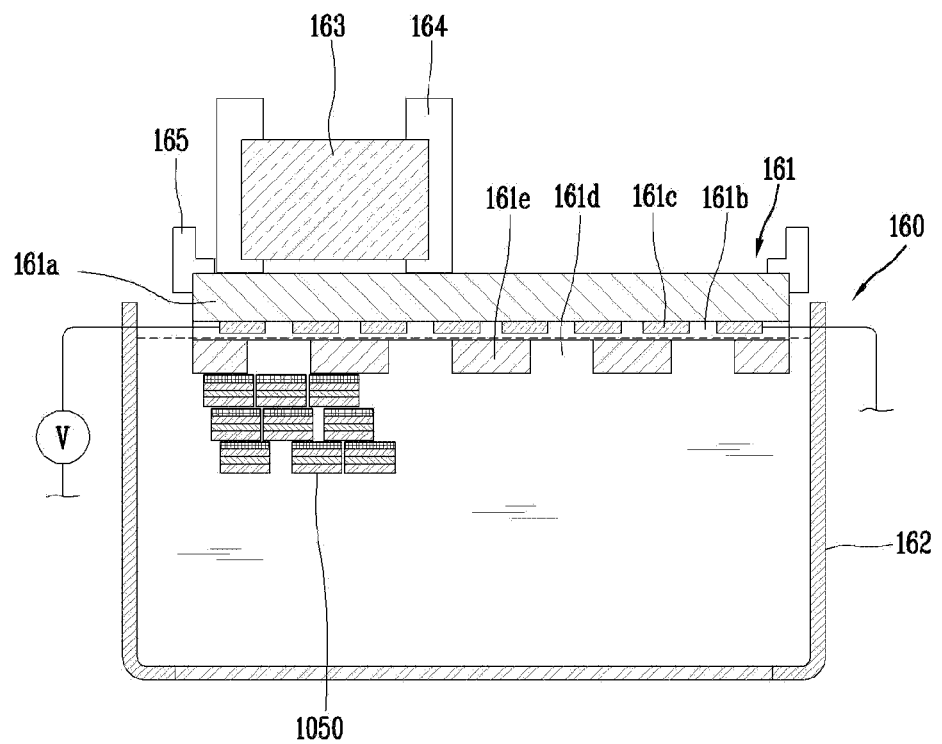

[FIG. 8c]
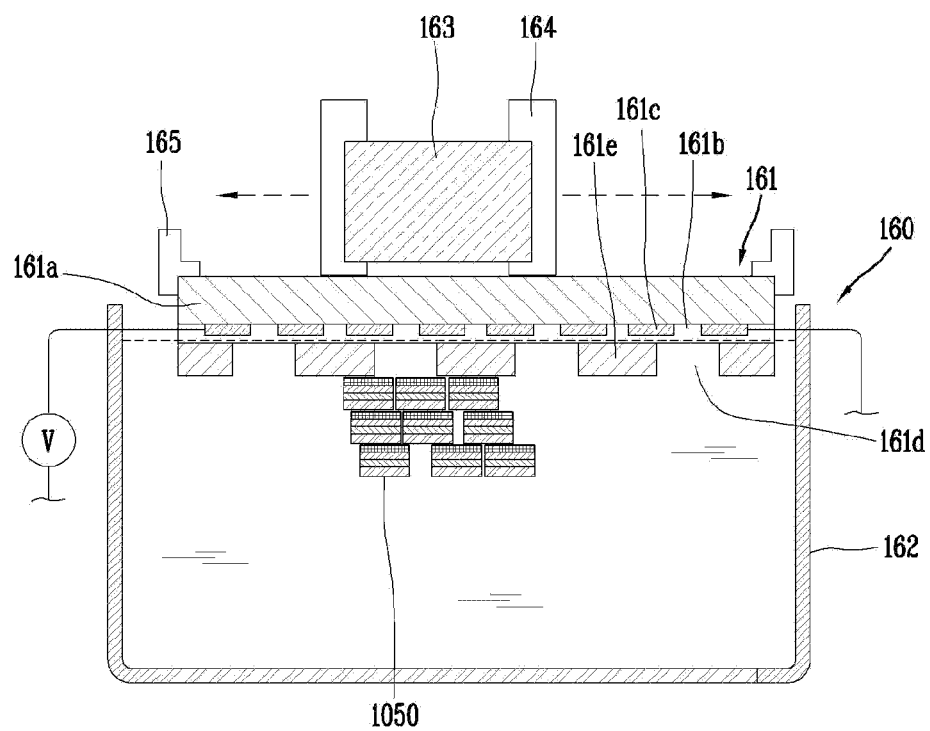

[FIG. 8d]
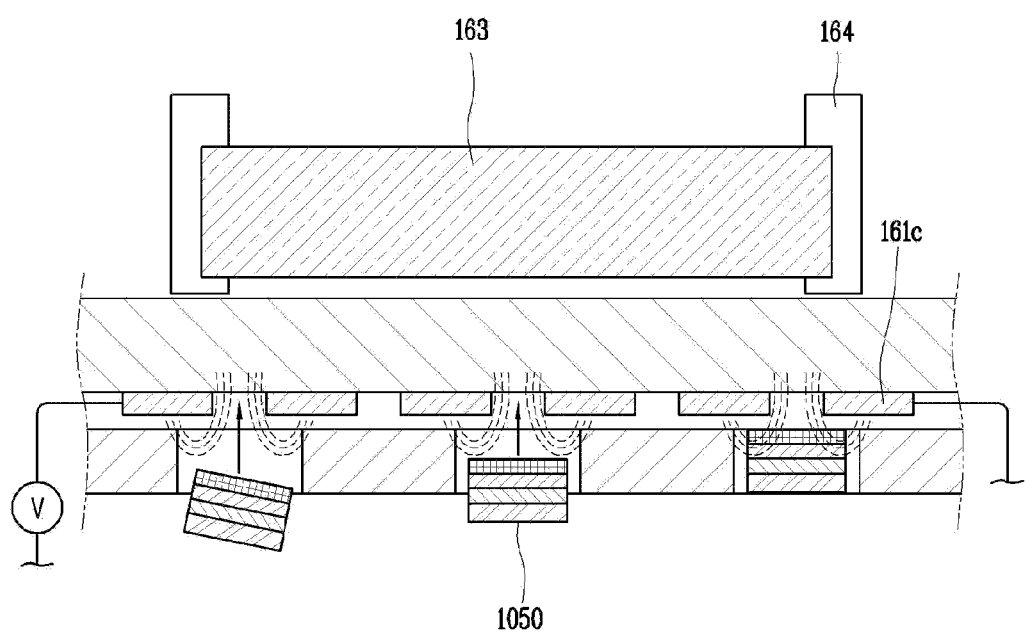

[FIG. 8e]
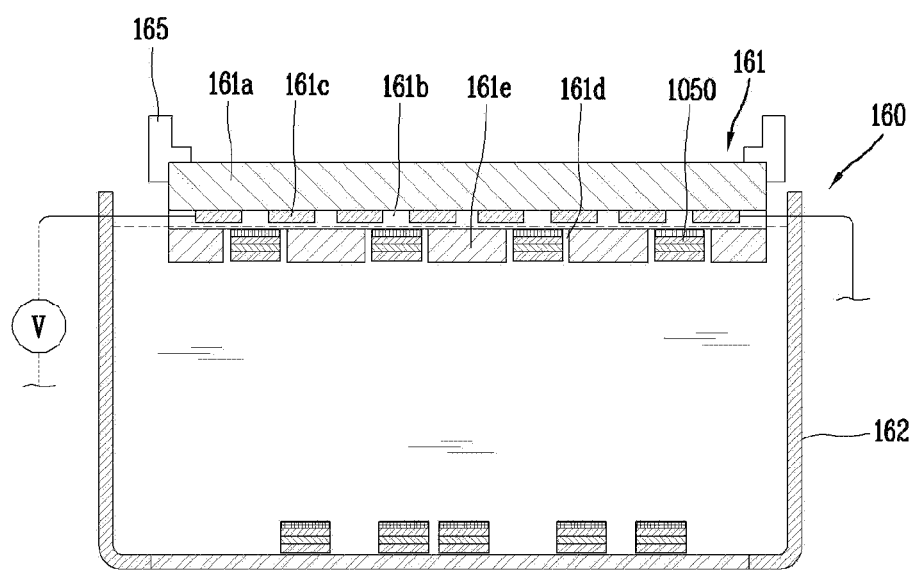

[FIG. 9]
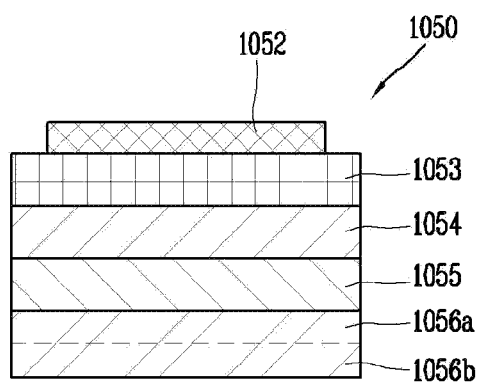

[FIG. 10]
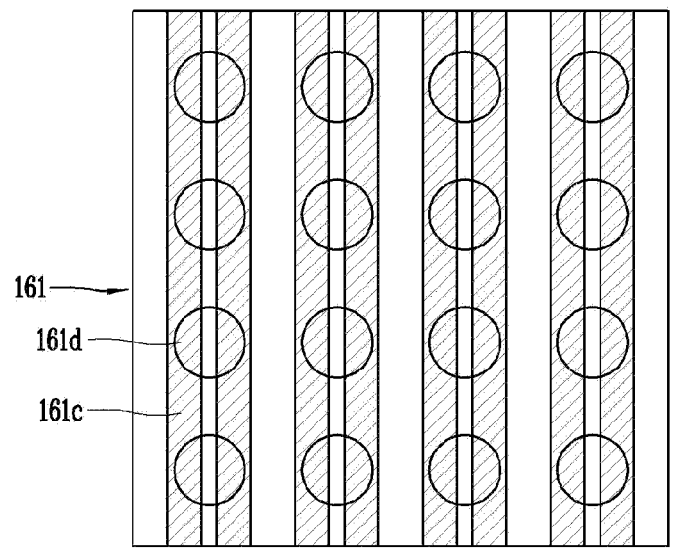

[FIG. 11]
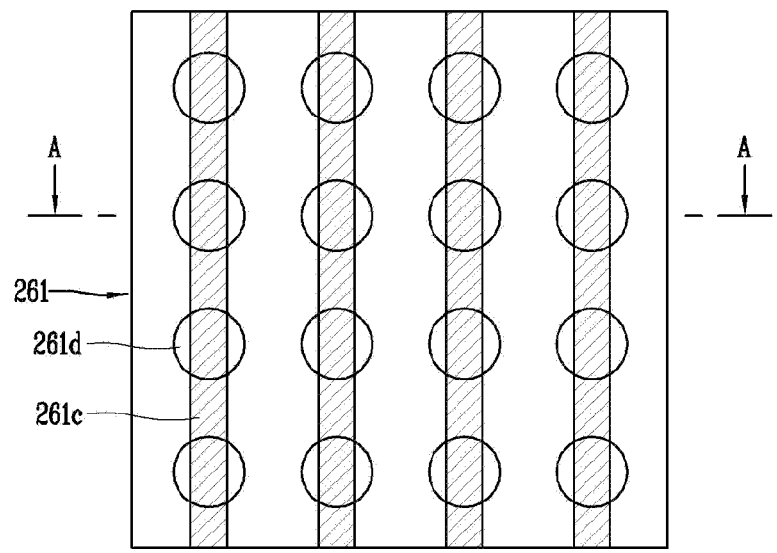

[FIG. 12]
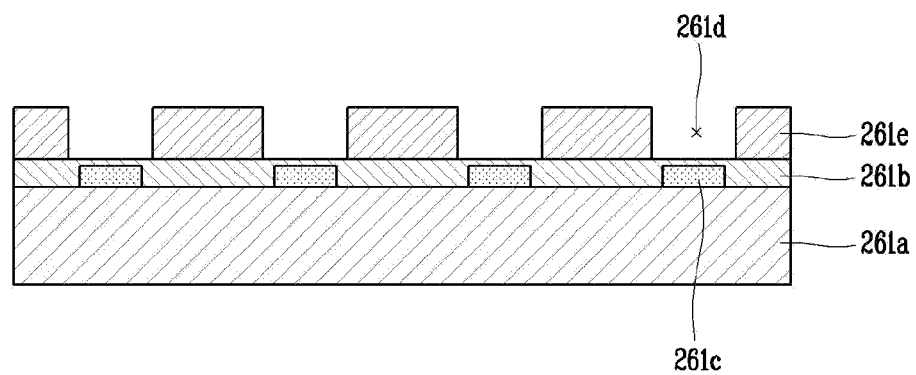

[FIG. 13]
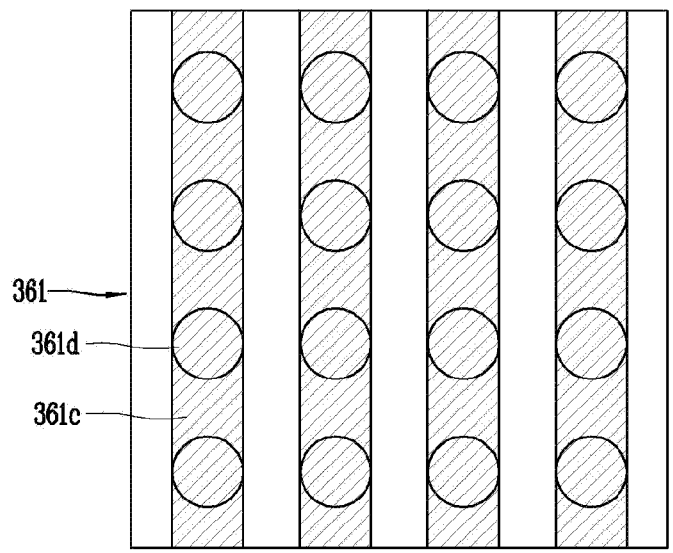

[FIG. 14]
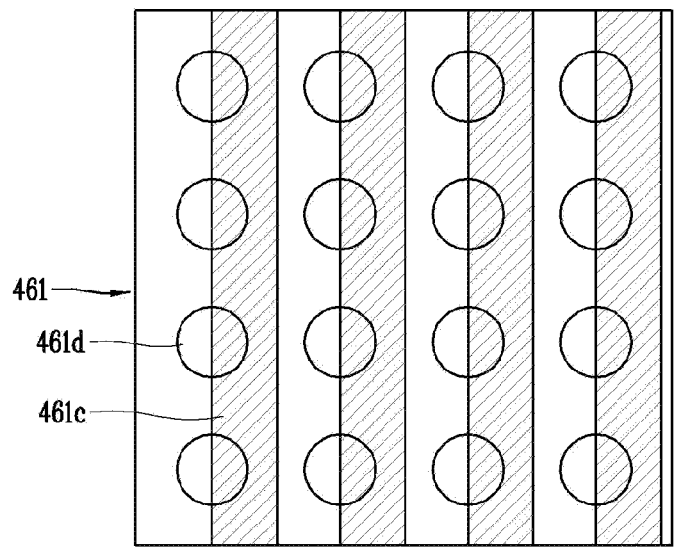

[FIG. 15]
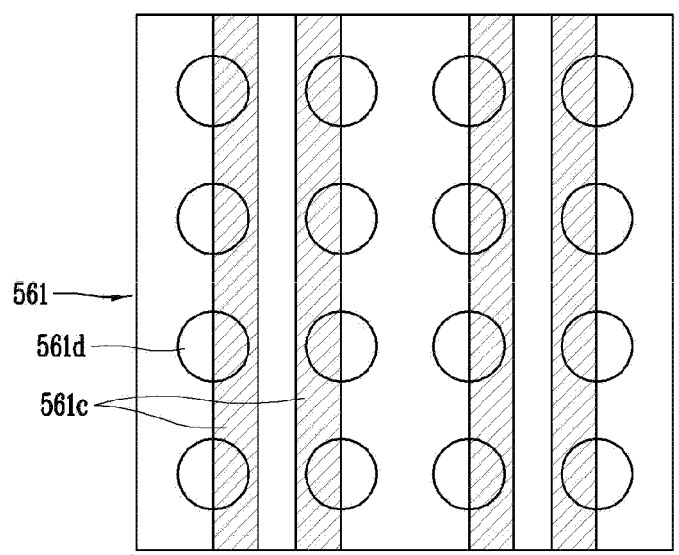

[FIG. 16]
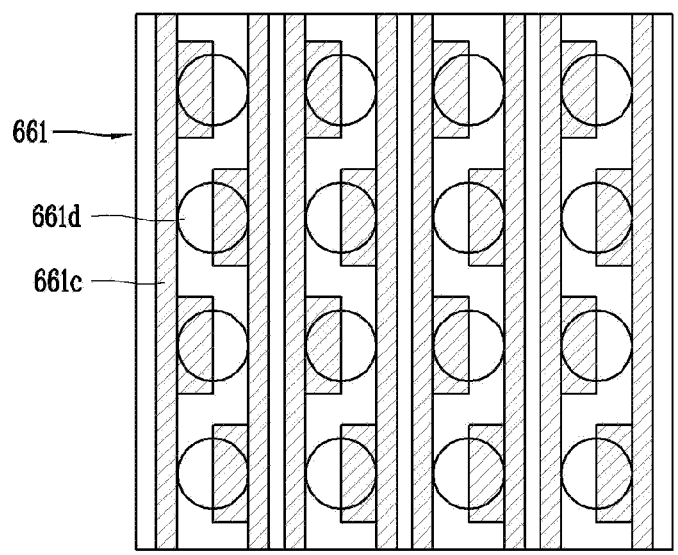

[FIG. 17]
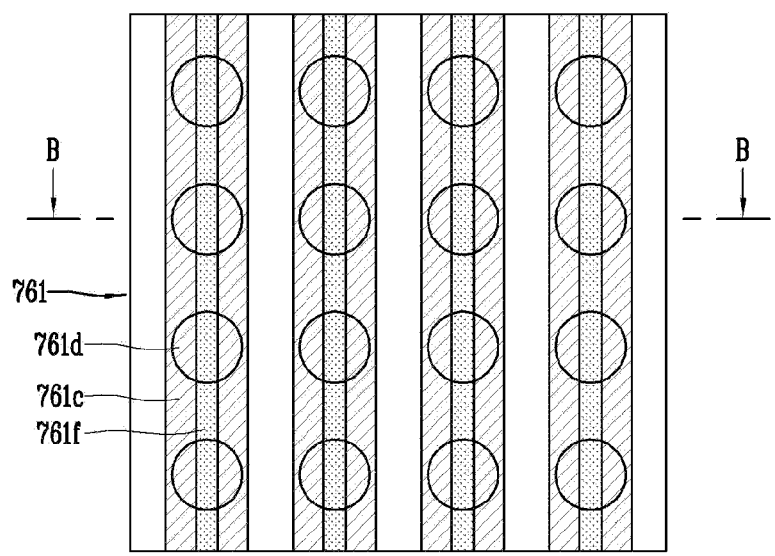

[FIG. 18]
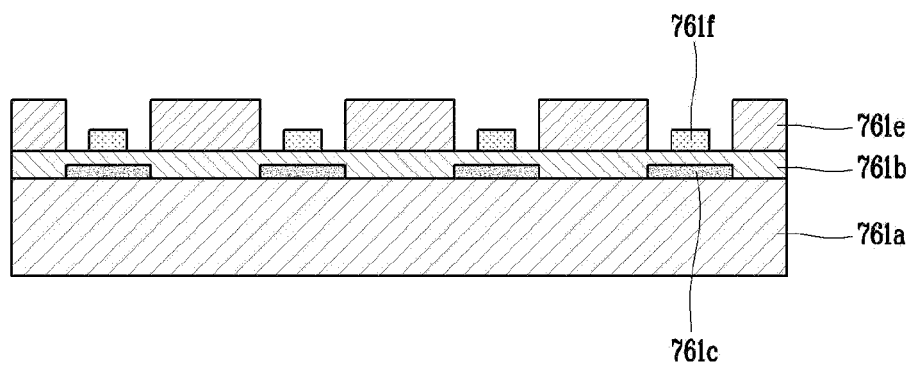

DISPLAY DEVICE MANUFACTURING METHOD, AND SUBSTRATE FOR MANUFACTURE OF DISPLAY DEVICE

CROSS REFERENCE TO RELATED APPLICATIONS

This application is the National Stage filing under 35 U.S.C. 371 of International Application No. PCT/KR2020/001881, filed on Feb. 11, 2020, which claims the benefit of earlier filing date and right of priority to Korean Application No. 10-2019-0078220, filed on Jun. 28, 2019, the contents of all these applications are hereby incorporated by reference herein in their entirety.

TECHNICAL FIELD

The present disclosure relates to a method of manufacturing a display device, and more particularly, to a method for manufacturing a display device using semiconductor light emitting diodes having a size of several $\mu m$ to several tens of $\mu m$, and an assembly board for manufacture of the display device.

BACKGROUND ART

Recently, liquid crystal displays (LCD), organic light emitting diode (OLED) displays, and micro LED displays are competing to implement large-screen displays in the field of display technology.

On the other hand, when a semiconductor light emitting diode (micro LED (uLED)) having a diameter or cross-sectional area of 100 microns or less is used for a display, very high efficiency may be achieved because the display does not absorb light using a polarizing plate or the like. However, since a large-screen display requires millions of semiconductor light emitting diodes, it is difficult to transfer the diodes compared to other technologies.

Techniques currently being developed as a transfer process include pick & place technology, laser lift-off (LLO) technology, or self-assembly technology. Among them, the self-assembly technology is a method in which the semiconductor light emitting diodes find its own position in a fluid, and is the most advantageous method for realizing a large-screen display device.

Recently, although a micro LED structure suitable for self-assembly has been proposed in U.S. Pat. No. 9,825,202, research on a technology for manufacturing a display through self-assembly of the micro LED has not been conducted sufficiently. Accordingly, the present disclosure proposes a new type of manufacturing method and manufacturing apparatus capable of self-assembly of micro LEDs.

DISCLOSURE

Technical Problem

One object of the present disclosure is to provide a new manufacturing process having high reliability in a large-screen display using micro-sized semiconductor light emitting diodes.

Another object of the present disclosure is to provide a manufacturing process capable of improving transfer precision when semiconductor light emitting diodes are self-assembled to an assembly board.

Still another object of the present disclosure is to provide an assembly board having a structure capable of improving transfer precision during self-assembly of semiconductor light emitting diodes having a size of several to several tens of micrometers at intervals of several tens of micrometers.

Another object of the present disclosure is to provide an assembly board having a structure capable of preventing a semiconductor light emitting diode from being seated at an unintended position during self-assembly.

Technical Solution

In order to achieve the above objects, the present disclosure provides an assembly board for use in a method for manufacturing a display device which allows semiconductor light emitting diodes to be seated at preset positions on the assembly board using an electric field and a magnetic field. Specifically, the assembly board includes a base portion, a plurality of assembly electrodes extending in one direction and disposed on the base portion, a dielectric layer stacked on the base portion to cover the assembly electrodes, and barrier ribs having a plurality of grooves for guiding the semiconductor light emitting diodes to the preset positions and formed on the base portion, wherein each of the grooves is arranged to overlap only one of the plurality of assembly electrodes such that an electric field is formed between the grooves adjacent to each other.

According to an embodiment, the assembly board may further include a metal shielding layer formed on the dielectric layer, and a portion of the metal shielding layer may be disposed inside the groove so that a part of the electric field formed inside the groove is shielded.

According to an embodiment, the metal shielding layer may be disposed to overlap the assembly electrode.

According to an embodiment, the metal shielding layer may extend in the same direction as an extending direction of the assembly electrode.

According to an embodiment, at least one type of insulating material may be disposed between the metal shielding layer and the assembly electrodes such that an insulating state between the metal shielding layer and the assembly electrodes are maintained.

According to an embodiment, the metal shielding layer includes a first region disposed inside the groove, and a second region excluding the first region, and the second region may be formed to have a larger area than the first region.

Further, according to an embodiment, a method for manufacturing a display device includes transferring an assembly board having barrier ribs including a plurality of assembly electrodes and a plurality of grooves to an assembly position, and putting semiconductor light emitting diodes into a fluid chamber, applying a magnetic force to the semiconductor light emitting diodes in the fluid chamber to move in one direction, applying voltages to the assembly electrodes such that the semiconductor light emitting diodes are guided into the grooves by an electric field formed between the assembly electrodes while the semiconductor light emitting diodes are moving in one direction, and transferring the semiconductor light emitting diodes seated on the assembly board to a wiring board, wherein a metal shielding layer is disposed inside the groove to shield a part of the electric field formed inside the groove.

Advantageous Effects

According to the present disclosure having the above configuration, a large number of semiconductor light emitting diodes can be assembled at once in a display device in which individual pixels are formed of micro light emitting diodes.

As described above, according to the present disclosure, it is possible to pixelate a semiconductor light emitting diode in a large amount on a small-sized wafer and then transfer it to a large-area substrate. Through this, it is possible to manufacture a large-screen display device at a low cost.

In addition, according to the manufacturing method of the present disclosure, semiconductor light emitting diodes in a solution are transferred simultaneously in place using a magnetic field and an electric field, thereby realizing low-cost, high-efficiency, and high-speed transfer regardless of the size and number of parts, and transfer area.

Furthermore, since assembly is performed using an electric field, selective assembly is possible through selective application of the electric field without a separate additional device or process. In addition, loading and unloading of the board can be facilitated by arranging the assembly board on the upper side of the chamber, and non-specific binding of the semiconductor light emitting diodes can be prevented.

In addition, when the assembly board according to the present disclosure is used, it is possible to prevent an electric field from being formed in an unnecessary position, so that self-assembly precision can be improved.

On the other hand, according to the present disclosure, the electric field formed between the assembled electrodes can be irregularly formed to allow the electric field to be concentrated in the groove provided in the barrier ribs. At the same time, according to the present disclosure, it is possible to prevent the semiconductor light emitting diode from being seated at an unintended position by shielding the electric field formed on the surface of the barrier ribs.

DESCRIPTION OF DRAWINGS

FIG. 1 is a conceptual diagram illustrating an embodiment of a display device using a semiconductor light emitting diode of the present disclosure.

FIG. 2 is a partially enlarged view of portion A of the display device of FIG. 1.

FIG. 3 is an enlarged view of the semiconductor light emitting diode of FIG. 2.

FIG. 4 is an enlarged view illustrating another embodiment of the semiconductor light emitting diode of FIG. 2.

FIGS. 5*a* to 5*e* are conceptual views for describing a new process of manufacturing the semiconductor light emitting diode.

FIG. 6 is a conceptual diagram illustrating an example of a self-assembly apparatus of a semiconductor light emitting diode according to the present disclosure.

FIG. 7 is a block diagram of the self-assembly apparatus of FIG. 6.

FIGS. 8*a* to 8*e* are conceptual views illustrating a process of self-assembling a semiconductor light emitting diode using the self-assembly apparatus of FIG. 6.

FIG. 9 is a conceptual diagram for describing the semiconductor light emitting diode of FIGS. 8*a* to 8*e*.

FIG. 10 is a conceptual diagram illustrating an assembly electrode included in an assembly board described with reference to FIGS. 8*a* to 8*e*.

FIGS. 11 and 12 are conceptual views illustrating an assembly electrode according to the present disclosure.

FIGS. 13 to 16 are conceptual views illustrating various modified embodiments of the assembly electrode according to the present disclosure.

FIGS. 17 and 18 are conceptual views illustrating an assembly board including a metal shielding layer.

MODE FOR INVENTION

Hereinafter, the embodiments disclosed herein will be described in detail with reference to the accompanying drawings, and the same or similar elements are designated with the same numeral references regardless of the numerals in the drawings and their redundant description will be omitted. The suffixes "module" and "unit or portion" for components used in the following description are merely provided only for facilitation of preparing this specification, and thus they are not granted a specific meaning or function. In addition, when it is determined that the detailed description of the related known technology may obscure the gist of embodiments disclosed herein in describing the embodiments, a detailed description thereof will be omitted. Further, it should be noted that the accompanying drawings are only for easy understanding of the embodiments disclosed in the present specification, and should not be construed as limiting the technical spirit disclosed in the present specification by the accompanying drawings.

It is also understood that when an element, such as a layer, region, or substrate, it is referred to as being "on" another element, it may be directly present on the other element or there are intervening elements therebetween.

The display device described herein may include mobile phones, smart phones, laptop computers, digital broadcasting terminals, personal digital assistants (PDA), portable multimedia players (PMP), navigation systems, slate PCs, a Tablet PC, Ultra Books, digital TVs, digital signages, head mounted displays (HMDs), desktop computers, and the like. However, it will be readily apparent to those skilled in the art that the configuration according to the embodiments described in the present specification may be applied to a device capable of display having even a new product form to be developed later.

FIG. 1 is a conceptual diagram illustrating an embodiment of a display device using a semiconductor light emitting diode of the present disclosure, FIG. 2 is a partially enlarged view of portion A of the display device of FIG. 1, FIG. 3 is an enlarged view of the semiconductor light emitting diode of FIG. 2, and FIG. 4 is an enlarged view illustrating another embodiment of the semiconductor light emitting diode of FIG. 2.

As illustrated, information processed by a control unit of a display device 100 may be output from a display module 140. A closed-loop-type case 101 surrounding edges of the display module may form a bezel of the display device.

The display module 140 may include a panel 141 on which images are displayed, and the panel 141 may include a micro-sized semiconductor light emitting diode 150 and a wiring board 110 on which the semiconductor light emitting diode 150 is mounted.

Wirings may be formed on the wiring board 110 to be connected to an n-type electrode 152 and a p-type electrode 156 of the semiconductor light emitting diode 150. Through this, the semiconductor light emitting diode 150 may be provided on the wiring board 110 as an individual pixel that emits light itself.

An image displayed on the panel 141 is visual information, and is implemented by independently controlling light emission of sub-pixels arranged in a matrix form through the wirings.

In the present disclosure, a micro LED (Light Emitting Diode) is exemplified as a type of the semiconductor light emitting diode 150 that converts current into light. The micro LED may be a light emitting diode formed in a small size of 100 micro or less. In the semiconductor light emitting diode 150, blue, red, and green colors are provided in light emitting regions, respectively, and a unit pixel may be realized by a combination thereof. That is, the unit pixel may mean a minimum unit for realizing one color, and at least three micro LEDs may be provided in the unit pixel.

More specifically, referring to FIG. 3, the semiconductor light emitting diode 150 may have a vertical structure.

For example, the semiconductor light emitting diode 150 is mainly made of gallium nitride (GaN), and indium (In) and/or aluminum (Al) are added together to implement a high output light emitting diode that emits various lights including blue.

The vertical semiconductor light emitting diode may include a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 formed on the n-type semiconductor layer 153. In this case, the p-type electrode 156 positioned in a lower portion may be electrically connected to the p-electrode of the wiring board, and the n-type electrode 152 positioned in an upper portion may be electrically connected to the n-electrode at the upper side of the semiconductor light emitting diode. The vertical semiconductor light emitting diode 150 has a great advantage in that it is possible to reduce the chip size because electrodes are arranged up and down.

As another example, referring to FIG. 4, the semiconductor light emitting diode may be a flip chip type light emitting diode.

For this example, the semiconductor light emitting diode 250 may include a p-type electrode 256, a p-type semiconductor layer 255 on which the p-type electrode 256 is formed, an active layer 254 formed on the p-type semiconductor layer 255, an n-type semiconductor layer 253 formed on the active layer 254, and an n-type electrode 252 spaced apart from the p-type electrode 256 in the horizontal direction on the n-type semiconductor layer 253. In this case, both the p-type electrode 256 and the n-type electrode 152 may be electrically connected to the p-electrode and n-electrode of the wiring board under the semiconductor light emitting diode.

The vertical semiconductor light emitting diode and the horizontal semiconductor light emitting diode may be a green semiconductor light emitting diode, a blue semiconductor light emitting diode, or a red semiconductor light emitting diode, respectively. In the case of the green semiconductor light emitting diode and the blue semiconductor light emitting diode, gallium nitride (GaN) is mainly used, and indium (In) and/or aluminum (Al) are added together to implement a high output light emitting diode that emits green or blue light. For this example, the semiconductor light emitting diode may be a gallium nitride thin film formed in various layers such as n-Gan, p-Gan, AlGaN, InGan, etc. Specifically, the p-type semiconductor layer may be P-type GaN, and the n-type semiconductor layer may be N-type GaN. However, in the case of the red semiconductor light emitting diode, the p-type semiconductor layer may be P-type GaAs, and the n-type semiconductor layer may be N-type GaAs.

In addition, the p-type semiconductor layer may be P-type GaN doped with Mg on the p-electrode side, and the n-type semiconductor layer may be N-type GaN doped with Si on the n-electrode side. In this case, the above-described semiconductor light emitting diodes may be semiconductor light emitting diodes having no active layer.

Meanwhile, referring to FIGS. 1 to 4, since the light emitting diodes are very small, unit pixels that emit light themselves may be arranged in a high definition in the display panel, thereby realizing a high-definition display device.

In the display device using the semiconductor light emitting diode of the present disclosure described above, the semiconductor light emitting diode grown on a wafer and formed through mesa and isolation is used as an individual pixel. In this case, the micro-sized semiconductor light emitting diode 150 needs to be transferred to the wafer at a predetermined position on a substrate of the display panel. There is a pick and place technique as such a transfer technique, but the success rate is low and a lot of time is required. As another example, there is a technique of transferring several devices at a time using a stamp or a roll, but it is not suitable for a large screen display due to a limitation in yield. The present disclosure proposes a new manufacturing method and manufacturing apparatus for a display device that can solve these problems.

To this end, a new method of manufacturing a display device will be described below. FIGS. 5a to 5e are conceptual views for describing a new process of manufacturing the semiconductor light emitting diode.

In the present specification, a display device using a passive matrix (PM) type semiconductor light emitting diode is taken as an example. However, the examples described below are also applicable to an active matrix (AM) type semiconductor light emitting diode. In addition, although a method of self-assembling a horizontal semiconductor light emitting diode is described as an example, it is also applicable to a method of self-assembling a vertical semiconductor light emitting diode.

First, according to the manufacturing method, a first conductivity type semiconductor layer 153, an active layer 154, and a second conductivity type semiconductor layer 155 are individually grown on a growth substrate 159 (FIG. 5a).

After the first conductivity type semiconductor layer 153 is grown, the active layer 154 is grown on the first conductivity type semiconductor layer 153, and then the second conductivity type semiconductor layer 155 is grown on the active layer 154. In this way, when the first conductivity type semiconductor layer 153, the active layer 154, and the second conductivity type semiconductor layer 155 are sequentially grown, as shown in FIG. 5a, the first conductivity type semiconductor layer 153, the active layer 154 and the second conductive semiconductor layer 155 form a stacked structure.

In this case, the first conductivity type semiconductor layer 153 may be a p-type semiconductor layer, and the second conductivity type semiconductor layer 155 may be an n-type semiconductor layer. However, the present disclosure is not necessarily limited thereto, and the first conductivity type may be n-type and the second conductivity type may be p-type.

In addition, although the present embodiment exemplifies the case in which the active layer is present, a structure in which the active layer is not present is also possible in some cases as described above. As an example, the p-type semiconductor layer may be P-type GaN doped with Mg, and the n-type semiconductor layer may be N-type GaN doped with Si on the n-electrode side.

The growth substrate 159 (wafer) may be formed of a material having a light-transmitting property, for example, any one of sapphire (Al2O3), GaN, ZnO, and AlO, but is not limited thereto. In addition, the growth substrate 159 may be formed of a material suitable for semiconductor material growth, a carrier wafer. The growth substrate 159 may be formed of a material having excellent thermal conductivity, and may include a conductive board or an insulating board, for example, a SiC board having higher thermal conductivity than a sapphire (Al2O3) board, or use at least one of Si, GaAs, GaP, InP, and Ga2O3.

Next, at least a portion of the first conductivity type semiconductor layer 153, the active layer 154, and the second conductivity type semiconductor layer 155 are removed to form a plurality of semiconductor light emitting diodes (FIG. 5b).

More specifically, isolation is performed such that the plurality of light emitting diodes form a light emitting diode array. That is, the first conductivity type semiconductor layer 153, the active layer 154, and the second conductivity type semiconductor layer 155 are vertically etched to form a plurality of semiconductor light emitting diodes.

In the case of forming a horizontal type semiconductor light emitting diode, a mesa process in which the active layer 154 and the second conductivity type semiconductor layer 155 are partially removed in the vertical direction and the first conductivity type semiconductor layer 153 is exposed to the outside and thereafter, isolation in which the first conductivity type semiconductor layer is etched to form a plurality of semiconductor light emitting diode arrays may be performed.

Next, second conductivity type electrodes 156 (or p-type electrodes) are formed on one surface of the second conductivity type semiconductor layer 155 (FIG. 5c). The second conductive electrode 156 may be formed by a deposition method such as sputtering, but the present disclosure is not limited thereto. However, when the first conductive semiconductor layer and the second conductive semiconductor layer are an n-type semiconductor layer and a p-type semiconductor layer, respectively, the second conductivity type electrode 156 may be an n-type electrode.

Then, the growth substrate 159 is removed to provide a plurality of semiconductor light emitting diodes. For example, the growth substrate 159 may be removed using a laser lift-off (LLO) method or a chemical lift-off (CLO) method (FIG. 5d).

Thereafter, the semiconductor light emitting diodes 150 are seated on a board in a chamber filled with a fluid (FIG. 5e).

For example, the semiconductor light emitting diodes 150 and the board are put in the chamber filled with a fluid, and the semiconductor light emitting diodes are self-assembled onto the board 161 using flow, gravity, surface tension, and the like. In this case, the board may be an assembly board 161.

As another example, it is also possible to put the wiring board in a fluid chamber instead of the assembly board 161 so that the semiconductor light emitting diodes 150 are directly seated on the wiring board. In this case, the board may be the wiring board. However, for convenience of description, in the present disclosure, the board is provided as, for example, the assembly board 161 on which the semiconductor light emitting diodes 1050 are seated.

Cells (not shown) in which the semiconductor light emitting diodes 150 are inserted may be provided in the assembly board 161 to facilitate mounting of the semiconductor light emitting diodes 150 on the assembly board 161. Specifically, cells in which the semiconductor light emitting diodes 150 are seated are formed in the assembly board 161 at positions where the semiconductor light emitting diodes 150 are to be aligned with wiring electrodes. The semiconductor light emitting diodes 150 are assembled to the cells while moving in the fluid.

After a plurality of semiconductor light emitting diodes are arrayed on the assembly board 161, the semiconductor light emitting diodes of the assembly board 161 are transferred to a wiring board, enabling large-area transfer. Accordingly, the assembly board 161 may be referred to as a temporary board.

On the other hand, in order to apply the self-assembly method described above to the manufacture of a large-screen display, it is necessary to increase transfer yield. The present disclosure proposes a method and apparatus for minimizing the influence of gravity or frictional force and preventing non-specific binding in order to increase the transfer yield.

In this case, in the display device according to the present disclosure, a magnetic material is disposed on the semiconductor light emitting diode to move the semiconductor light emitting diode using magnetic force, and the semiconductor light emitting diode is seated at a predetermined position by using an electric field during movement. Hereinafter, the transfer method and apparatus will be described in more detail with the accompanying drawings.

FIG. 6 is a conceptual diagram illustrating an example of a self-assembly apparatus of a semiconductor light emitting diode according to the present disclosure, and FIG. 7 is a block diagram of the self-assembly apparatus of FIG. 6. FIGS. 8a to 8e are conceptual views illustrating a process of self-assembling a semiconductor light emitting diode using the self-assembly apparatus of FIG. 6, and FIG. 9 is a conceptual diagram for describing the semiconductor light emitting diode of FIGS. 8a to 8e.

Referring to FIGS. 6 and 7, a self-assembly apparatus 160 of the present disclosure may include a fluid chamber 162, a magnet 163 and a position control unit 164.

The fluid chamber 162 has a space for accommodating a plurality of semiconductor light emitting diodes. The space may be filled with a fluid, and the fluid may include water or the like as an assembly solution. Accordingly, the fluid chamber 162 may be a water tank and may be configured in an open type. However, the present disclosure is not limited thereto, and the fluid chamber 162 may be of a closed type in which the space is a closed space.

The board 161 may be disposed in the fluid chamber 162 such that an assembly surface on which the semiconductor light emitting diodes 150 are assembled faces downward. For example, the board 161 may be transferred to an assembly position by a transfer device, and the transfer device may include a stage 165 on which the board is mounted. The position of the stage 165 is controlled by the control unit, and through this, the board 161 may be transferred to the assembly position.

In this case, in the assembly position, the assembly surface of the board 161 faces the bottom of the fluid chamber 150. As shown, the assembly surface of the board 161 is disposed to be immersed in the fluid in the fluid chamber 162. Accordingly, the semiconductor light emitting diode 150 moves to the assembly surface in the fluid.

The board 161 is an assembly board in which an electric field is able to be formed, and may include a base portion 161a, a dielectric layer 161b, and a plurality of electrodes 161c.

The base portion 161a may be formed of an insulating material, and the plurality of electrodes 161c may be a thin or thick bi-planar electrode patterned on one surface of the base portion 161a. The electrode 161c may be formed of, for example, a stack of Ti/Cu/Ti, Ag paste, and ITO.

The dielectric layer 161b may be formed of an inorganic material such as SiO2, SiNx, SiON, Al2O3, TiO2, HfO2, or the like. Alternatively, the dielectric layer 161b may be comprised of a single layer or a multi-layer as an organic insulator. The dielectric layer 161b may have a thickness of several tens of nm to several μm.

Furthermore, the board 161 according to the present disclosure includes a plurality of cells 161d separated by barrier ribs. The cells 161d are sequentially arranged in one direction and may be made of a polymer material. Also, the barrier ribs 161e defining the cells 161d are shared with the neighboring cells 161d. The barrier ribs 161e may protrude from the base portion 161a, and the cells 161d may be sequentially arranged along one direction by the barrier ribs 161e. More specifically, the cells 161d are sequentially arranged in the column and row directions, respectively, and may have a matrix structure.

As shown, the cell 161d may have a groove for accommodating the semiconductor light emitting diode 150 and the groove may be a space defined by the barrier ribs 161e. The shape of the groove may be the same as or similar to that of the semiconductor light emitting diode. For example, when the semiconductor light emitting diode has a rectangular shape, the groove may have a rectangular shape. Also, although not shown, when the semiconductor light emitting diode has a circular shape, the groove formed in the cells may have a circular shape. Furthermore, each of the cells is configured to accommodate a single semiconductor light emitting diode. That is, one semiconductor light emitting diode is accommodated in one cell.

Meanwhile, the plurality of electrodes 161c may include a plurality of electrode lines disposed at the bottom of each of the cells 161d, and the plurality of electrode lines may extend to adjacent cells.

The plurality of electrodes 161c are disposed below the cells 161d, and different polarities are applied to the electrodes 161c to generate an electric field in the cells 161d. To form the electric field, the dielectric layer may form the bottom of the cells 161d while the dielectric layer is covering the plurality of electrodes 161c. In this structure, when different polarities are applied to the pair of electrodes 161c under the cells 161d, an electric field is formed, and the semiconductor light emitting diodes may be inserted into the cells 161d due to the electric field.

In the assembly position, the electrodes of the board 161 are electrically connected to a power supply device 171. The power supply device 171 may apply power to the plurality of electrodes to generate the electric field.

As shown, the self-assembly apparatus may include a magnet 163 for applying a magnetic force to the semiconductor light emitting diodes. The magnet 163 is spaced apart from the fluid chamber 162 to apply a magnetic force to the semiconductor light emitting diodes 150. The magnet 163 may be disposed to face the opposite surface of the assembly surface of the board 161, and the position of the magnet is controlled by the position control unit 164 connected to the magnet 163.

The semiconductor light emitting diode 1050 may include a magnetic material to move in the fluid due to the magnetic field of the magnet 163.

Referring to FIG. 9, a semiconductor light emitting diode including a magnetic material may include a first conductivity type electrode 1052, a second conductivity type electrode 1056, a first conductivity type semiconductor layer 1053 on which the first conductivity type electrode 1052 is disposed, a second conductivity type semiconductor layer 1055 on which the second conductivity type electrode 1056 is disposed, the second conductivity type semiconductor layer 1055 overlapping the first conductivity type semiconductor layer 1052 and an active layer 1054 disposed between the first and second conductivity type semiconductor layers 1053 and 1055.

Here, the first conductivity type may be p-type, the second conductivity type may be n-type, and vice versa. In addition, as described above, the semiconductor light emitting diode having no active layer may be used.

Meanwhile, in the present disclosure, the first conductivity type electrode 1052 may be generated after the semiconductor light emitting diode is assembled to the wiring board through self-assembly of the semiconductor light emitting diode. Also, in the present disclosure, the second conductivity type electrode 1056 may include the magnetic material. The magnetic material may mean a magnetic metal. The magnetic material may be Ni, SmCo, or the like, and as another example, may include a material corresponding to at least one of Gd-based, La-based, and Mn-based materials.

The magnetic material may be provided in the second conductivity type electrode 1056 in the form of particles. Alternatively, the conductivity type electrode including a magnetic material may have one layer formed of a magnetic material. For this example, as shown in FIG. 9, the second conductivity type electrode 1056 of the semiconductor light emitting diode 1050 may include a first layer 1056a and a second layer 1056b. Here, the first layer 1056a may include a magnetic material, and the second layer 1056b may include a metal material rather than a magnetic material.

As shown, in this example, the first layer 1056a including a magnetic material may be disposed to contact the second conductivity type semiconductor layer 1055. In this case, the first layer 1056a is disposed between the second layer 1056b and the second conductivity type semiconductor layer 1055. The second layer 1056b may be a contact metal connected to the second electrode of the wiring board. However, the present disclosure is not necessarily limited thereto, and the magnetic material may be disposed on one surface of the first conductivity type semiconductor layer.

Referring back to FIGS. 6 and 7, more specifically, the self-assembly apparatus is provided with a magnet handler that is movable automatically or manually in the x, y, and z axes on the upper portion of the fluid chamber, or a motor capable of rotating the magnet 163. The magnet handler and the motor may constitute the position control unit 164. Through this, the magnet 163 may rotate in a horizontal direction with the board 161, clockwise or counterclockwise direction.

Meanwhile, a bottom plate 166 having a light-transmitting property may be formed in the fluid chamber 162, and the semiconductor light emitting diodes may be disposed between the bottom plate 166 and the board 161. An image sensor 167 may be disposed to face the bottom plate 166 to monitor the inside of the fluid chamber 162 through the bottom plate 166. The image sensor 167 is controlled by the control unit 172 and may include an inverted type lens, a CCD and the like to observe the assembly surface of the board 161.

The self-assembly apparatus described above is configured to use a combination of a magnetic field and an electric field, and when using this, the semiconductor light emitting diodes may be seated at predetermined positions on the board due to an electric field while moving by a change in the position of the magnet. Hereinafter, an assembly process using the self-assembly apparatus described above will be described in more detail.

First, a plurality of semiconductor light emitting diodes 1050 including a magnetic material are formed through the process described with reference to FIGS. 5A to 5C. In this case, in the process of forming the second conductivity type electrode of FIG. 5c, a magnetic material may be deposited on the semiconductor light emitting diode.

Next, the board 161 is transferred to an assembly position, and the semiconductor light emitting diodes 1050 are put into the fluid chamber 162 (FIG. 8a).

As described above, the assembly position of the board 161 may be a position in which the board 161 is to be disposed in the fluid chamber 162 such that the assembly surface of the board 161 on which the semiconductor light emitting diodes 1050 are to be assembled faces downward.

In this case, some of the semiconductor light emitting diodes 1050 may sink to the bottom of the fluid chamber 162 and some may float in the fluid. The bottom plate 166 having a light-transmitting property is provided in the fluid chamber 162, and some of the semiconductor light emitting diodes 1050 may sink to the bottom plate 166.

Next, a magnetic force is applied to the semiconductor light emitting diodes 1050 such that the semiconductor light emitting diodes 1050 vertically float in the fluid chamber 162 (FIG. 8b)

When the magnet 163 of the self-assembly apparatus moves from its original position to the opposite surface of the assembly surface of the board 161, the semiconductor light emitting diodes 1050 may float toward the board 161 in the fluid. The original position may be a position deviated from the fluid chamber 162. As another example, the magnet 163 may be made of an electromagnet. In this case, electricity is supplied to the electromagnet to generate an initial magnetic force.

Meanwhile, in this example, when the magnitude of the magnetic force is adjusted, the separation distance between the assembly surface of the board 161 and the semiconductor light emitting diodes 1050 may be controlled. For example, the separation distance is controlled using the weight, buoyancy, and magnetic force of the semiconductor light emitting diodes 1050. The separation distance may be several millimeters to several tens of micrometers from the outermost edge of the board.

Next, a magnetic force is applied to the semiconductor light emitting diodes 1050 such that the semiconductor light emitting diodes 1050 move in one direction in the fluid chamber 162. For example, it is possible to move the magnet 163 in a direction horizontal to the board, clockwise or counterclockwise (FIG. 8c). In this case, the semiconductor light emitting diodes 1050 move in a direction parallel to the board 161 from positions spaced apart from the board 161 due to the magnetic force.

Next, an electric field is applied to guide the semiconductor light emitting diodes 1050 to preset positions such that the semiconductor light emitting diodes 1050 are seated in the preset positions of the board 161 while the semiconductor light emitting diodes 1050 are moving (FIG. 8c). For example, while the semiconductor light emitting diodes 1050 are moving in a direction horizontal to the board 161, the semiconductor light emitting diodes 1050 may move in a direction perpendicular to the board 161 due to the electric field, and be then seated in the preset positions of the board 161.

More specifically, an electric field is generated by supplying power to the bi-planar electrode of the board 161 to enable assembly to be made only at preset positions. That is, the semiconductor light emitting diodes 1050 are self-assembled at assembly positions of the board 161 by using the selectively generated electric field. To this end, cells in which the semiconductor light emitting diodes 1050 are inserted may be provided in the board 161.

Thereafter, a process of unloading the board 161 is performed, and the assembly process is finished. When the board 161 is an assembly board, a post-process for realizing a display device by transferring the semiconductor light emitting diodes arranged as described above to a wiring board may be performed.

Meanwhile, after guiding the semiconductor light emitting diodes 1050 to the preset positions, the magnet 163 may be moved in a direction away from the board 161 such that the semiconductor light emitting diodes 1050 remaining in the fluid chamber 162 fall to the bottom of the fluid chamber 162 (FIG. 8d). As another example, when power supply is stopped in a case where the magnet 163 is an electromagnet, the semiconductor light emitting diodes 1050 remaining in the fluid chamber 162 may fall to the bottom of the fluid chamber 162.

Thereafter, when the semiconductor light emitting diodes 1050 at the bottom of the fluid chamber 162 are recovered, the recovered semiconductor light emitting diodes 1050 may be reused.

The self-assembly apparatus and method described above may use a magnetic field to enable distant parts to congregate near a predetermined assembly site and apply a separate electric field to the assembly site such that the parts are selectively assembled only to the assembly site in order to increase the assembly yield in fluidic assembly. In this case, the assembly board is placed on the upper portion of the water tank and the assembly surface is directed downward to minimize the effect of gravity due to the weight of the parts and prevent non-specific binding to eliminate defects. That is, to increase the transfer yield, the assembly board is placed on the upper portion to minimize the effect of gravity or frictional force, and to prevent non-specific binding.

As described above, according to the present disclosure having the above configuration, in a display device in which individual pixels are formed of semiconductor light emitting diodes, a large number of semiconductor light emitting diodes may be assembled at once.

As described above, according to the present disclosure, it is possible to pixelate a large amount of semiconductor light emitting diodes on a small-sized wafer and then transfer the semiconductor light emitting diodes to a large-area substrate. Through this, it is possible to manufacture a large-screen display device at a low cost.

On the other hand, in order to realize a high-resolution display, the size of the semiconductor light emitting diodes need to be reduced, and the interval between the semiconductor light emitting diodes need to be narrowed. In addition, in order to reduce the intervals between the semiconductor light emitting diodes, the width of the assembly electrode and the interval between the assembly electrodes, which are essential components of the self-assembly method described above, also need to be reduced.

Specifically, the semiconductor light emitting diode according to the present disclosure has a size of several um to several tens of μm, and the interval between the semiconductor light emitting diodes needs to be within several tens of μm. In this case, the width of the assembly electrodes needs to be several μm to several tens of μm, and the interval between the assembly electrodes needs to be within several tens of μm. Furthermore, depending on the arrangement of the assembly electrodes, the interval between the assembly electrodes may need to be within several µm.

The present disclosure provides a structure for reducing the width of the assembly electrode used in self-assembly and the interval between the assembly electrodes. Hereinafter, the assembly electrode according to the present disclosure will be described in detail.

FIG. 10 is a conceptual diagram illustrating an assembly electrode included in an assembly board described with reference to FIGS. 8a to 8e, and FIGS. 11 and 12 are conceptual views illustrating an assembly electrode according to the present disclosure Referring to FIG. 10, the assembly electrodes described with reference to FIGS. 8a to 8e are arranged in pairs in each of the grooves defined by the barrier ribs. That is, the plurality of assembly electrodes are disposed to overlap each other in the plurality of grooves. Voltages of different polarities are respectively applied to the pair of electrodes, and an electric field is formed between the pair of electrodes. Since the pair of electrodes are disposed to overlap each other in each of the plurality of grooves, an electric field is formed in the groove.

When the size of the semiconductor light emitting diode is reduced and the interval between the semiconductor light emitting diodes is narrowed, arrangement of the assembly electrode as shown in FIG. 10 may be limited. Specifically, the size of the groove formed in the barrier ribs is proportional to the size of the semiconductor light emitting diode. When the size of the semiconductor light emitting diode is reduced, the size of the groove may be also reduced. When the size of the groove is reduced, the width of the pair of electrodes and the interval between the pair of electrodes need to be reduced. In addition, as the interval between the semiconductor light emitting diodes decreases, the interval between the assembly electrodes should also decrease.

For the above reasons, when the size of the semiconductor light emitting diode and the interval between the semiconductor light emitting diodes are less than a certain level, forming the assembly electrode in the structure described with reference to FIG. 10 is limited. Specifically, when the size of the semiconductor light emitting diode is within several µm to several tens of µm, the interval between the pair of electrodes should be within several µm.

According to the present disclosure, each of the grooves is arranged to overlap only one of the plurality of assembly electrodes such that an electric field is formed between the grooves adjacent to each other.

Specifically, referring to FIGS. 11 and 12, only one assembly electrode 261c may overlap one groove 261d at an assembly board 261 having a base portion 261a, a dielectric layer 261b and a barrier rib 26le. Here, the entire assembly electrode 261c does not need to overlap the groove 261d, and only a portion of the assembly electrode 261c may overlap the groove 261d.

In this case, voltages having different polarities are applied to one of the plurality of assembly electrodes 261c and to an assembly electrode adjacent to the one of the plurality of assembly electrodes 261c. Accordingly, an electric field is formed between two adjacent assembly electrodes. When a part of the assembly electrode overlaps the groove, an electric field is also formed inside the groove. Accordingly, the assembly electrode having the structure according to FIGS. 11 and 12 may form an electric field that guides the semiconductor light emitting diode into the groove.

The above-described assembly electrode may be implemented in various forms.

FIGS. 13 to 16 are conceptual views illustrating various modified embodiments of the assembly electrode according to the present disclosure.

Referring to FIG. 13, at an assembly board 361, an assembly electrode 361c may be formed to extend in one direction in which the groove 361d is formed. Also, the width of the assembly electrode 361c may be equal to the diameter of the groove 361d. Accordingly, the assembly electrode 361c and the groove 361d may completely overlap each other. In this case, the intervals between all of the assembly electrodes may be uniform.

In another embodiment, referring to FIG. 14, at an assembly board 461, the assembly electrode 461c may be formed to extend in one direction in which the groove 461d is formed. In addition, the assembly electrode 461c may be disposed to overlap a half of the total area of the groove 461d. Even in this case, an electric field may be formed inside the groove. In this case, the intervals between all of the assembly electrodes may be uniform.

Meanwhile, in FIGS. 11 to 14, an embodiment in which the intervals between the assembly electrodes are all constant has been described. However, the present disclosure is not limited thereto, and an interval between some assembly electrodes and an interval between the remaining assembly electrodes may be different from each other.

Referring to FIG. 15, at an assembly board 561 with grooves 561d, an interval between some of the assembly electrodes 561c and an interval between the remaining assembly electrodes may be different from each other. In this case, a strong electric field is formed between the assembly electrodes arranged with a narrow interval. Through this, according to the present disclosure, it is possible to enable the electric field formed between the assembly electrodes to be concentrated inside the groove.

Meanwhile, each of the assembly electrodes may include a protrusion. The protrusion may be disposed to overlap any one of the plurality of grooves. Referring to FIG. 16, at an assembly board 661 having grooves 661d, one of the plurality of assembly electrodes 661c may have a plurality of protrusions. Any one of the plurality of grooves arranged in one direction may overlap a protrusion formed in the one assembly electrode, and the other groove adjacent to the one groove does not overlap a protrusion formed in the one assembly electrode. The other groove may overlap a protrusion formed in the other assembly electrode adjacent to the one assembly electrode. As described above, by arranging the plurality of grooves to alternately overlap protrusions formed on the assembly electrodes, it is possible to minimize the interval between the assembly electrodes and enable the electric field formed between the assembly electrodes to be concentrated in the groove.

On the other hand, the present disclosure may allow the electric field formed between the assembly electrodes to be non-uniform. Specifically, the present disclosure may allow the electric field to be non-uniformly formed, so that the electric field may be concentrated only in the groove.

Specifically, the present disclosure may further include a metal shielding layer formed on the dielectric layer such that an electric field formed between the assembly electrodes is non-uniform. Hereinafter, the metal shielding layer will be described in detail.

FIGS. 17 and 18 are conceptual views illustrating an assembly board including a metal shielding layer.

The metal shielding layer 761f is disposed to overlap a portion of the assembly electrode 761c. When the metal shielding layer 761f overlaps the entire assembly electrode 761c, the electric field is completely blocked. In this case, since the semiconductor light emitting diode cannot be guided to a preset position during self-assembly, the metal shielding layer 761f needs to overlap a part of the assembly electrode 761c.

Meanwhile, the metal shielding layer 761f may extend in the same direction as the extending direction of the assembly electrode 761c. That is, the metal shielding layer 761f may be formed in a bar shape like the assembly electrode 761c.

In an embodiment, referring to FIGS. 17 and 18, the metal shielding layer 761f may be disposed to overlap the center of the assembly electrode 761c at an assembly board 761. The metal shielding layer 761f may shield the electric field to allow a non-uniform electric field to be formed in the groove 761d. Due to the metal shielding layer 761f, an electric field having a similar shape to the electric field formed between the pair of electrodes described with reference to FIG. 10 may be formed in the groove. That is, according to the present disclosure, the electric field similar to that of the pair of electrodes may be formed without using the pair of electrodes.

Referring to FIG. 18, a portion of the metal shielding layer 761f may be disposed on the bottom surface of the groove 761d, that is, the dielectric layer 761b formed on a base portion 761a. The metal shielding layer 761f and the assembly electrode 761c need to be electrically insulated from each other. When the metal shielding layer 761f and the assembly electrode 761c are electrically connected to each other, the metal shielding layer 761f cannot function as a shielding layer. Accordingly, at least one type of insulating material needs to be disposed between the metal shielding layer 761f and the assembly electrode 761c.

Referring back to FIG. 17, since the metal shielding layer 761f is disposed along the assembly electrode, a portion of the metal shielding layer 761f is disposed between the barrier rib 761e and the dielectric layer 761b. That is, a portion of the metal shielding layer 761f is not exposed to the outside during self-assembly.

In this specification, the metal shielding layer 761f is divided into two regions. Specifically, the metal shielding layer 761f includes a first region disposed inside the groove and a second region excluding the first region. Here, the second region overlaps the barrier rib 761e and is not exposed to the outside during self-assembly.

The second region may serve to prevent the semiconductor light emitting diode from being coupled to the surface of the barrier rib during self-assembly. Specifically, the second region may shield an electric field formed on the surface of the barrier rib during self-assembly, thereby preventing the semiconductor light emitting diode from being guided to the surface of the barrier rib rather than the inside of the groove.

Preferably, the second region may be formed to have a larger area than the first region. Specifically, since the shielding effect against the surface of the barrier rib increases as the width of the second region increases, the width of the second region is preferably wider than that of the first region.

As described above, the metal shielding layer according to the present disclosure forms a non-uniform electric field, thereby allowing the electric field formed between the assembly electrodes to be concentrated in the groove, and at the same time, and preventing the semiconductor light emitting diode from being mis-assembled by shielding the electric field formed on the surface of the barrier ribs.

The invention claimed is:

1. An assembly board for use in a method for manufacturing a display device which allows semiconductor light emitting diodes to be seated at preset positions on the assembly board using an electric field and a magnetic field, the assembly board comprising:
a base portion;
a plurality of assembly electrodes extending in one direction and disposed on the base portion;
a dielectric layer stacked on the base portion to cover the plurality of assembly electrodes; and
barrier ribs having a plurality of grooves for guiding the semiconductor light emitting diodes to the preset positions and formed on the base portion,
wherein each of the plurality of grooves is arranged to overlap only one assembly electrode of the plurality of assembly electrodes so that an electric field is formed between the plurality of grooves adjacent to each other.

2. The assembly board of claim 1, further comprising:
a metal shielding layer formed on the dielectric layer,
wherein a portion of the metal shielding layer is disposed inside a groove of the plurality of grooves so that a part of the electric field formed inside the groove is shielded.

3. The assembly board of claim 2, wherein the metal shielding layer is disposed to overlap the one assembly electrode.

4. The assembly board of claim 3, wherein the metal shielding layer extends in the same direction as an extending direction of the one assembly electrode.

5. The assembly board of claim 2, wherein at least one type of insulating material is disposed between the metal shielding layer and the plurality of assembly electrodes such that an insulating state between the metal shielding layer and the plurality of assembly electrodes are maintained.

6. The assembly board of claim 2, wherein the metal shielding layer includes
a first region disposed inside the groove; and
a second region excluding the first region,
wherein the second region is formed to have a larger area than the first region.

7. The assembly board of claim 2, wherein the metal shielding layer is arranged to bisect each of the plurality of grooves.

8. The assembly board of claim 2, wherein a width of the metal shielding layer is less than a width of the one assembly electrode.

9. The assembly board of claim 1, wherein a width of the one assembly electrode is different from a width of each of the plurality of grooves.

10. The assembly board of claim 9, wherein the width of the one assembly electrode is greater than the width of each of the plurality of grooves.

11. The assembly board of claim 1, wherein a width of the one assembly electrode is the same as a width of each of the plurality of grooves.

12. The assembly board of claim 1, wherein an overlap of each of the plurality of grooves with the one assembly electrode range from overlap of a total area of each of the plurality of grooves to overlap of half of the total area of each of the plurality of grooves.

13. The assembly board of claim 1, wherein each of the plurality of grooves only partially overlaps the one assembly electrode.

14. The assembly board of claim 1, wherein the one assembly electrode includes a plurality of protrusions, and
wherein each of the plurality of grooves respectively overlap the plurality of protrusions.

15. A method for manufacturing a display device, the method comprising:

transferring an assembly board to an assembly position, and putting semiconductor light emitting diodes into a fluid chamber, the assembly board including a plurality of assembly electrodes and barrier ribs having a plurality of grooves;

applying a magnetic force to the semiconductor light emitting diodes in the fluid chamber to move the semiconductor light emitting diodes in one direction;

applying voltages to the plurality of assembly electrodes such that the semiconductor light emitting diodes are guided into the plurality of grooves by an electric field formed between the plurality of assembly electrodes while the semiconductor light emitting diodes are moving in the one direction; and transferring the semiconductor light emitting diodes seated on the assembly board to a wiring board, wherein a metal shielding layer is disposed inside a groove of the plurality of grooves to shield a part of the electric field formed inside the groove.

16. The method of claim 15, wherein each of the plurality of grooves is arranged to overlap only one assembly electrode of the plurality of assembly electrodes such that the electric field is formed between the plurality of grooves adjacent to each other.

17. An assembly board of a display device where semiconductor light emitting diodes are seated at preset positions on the assembly board, the assembly board comprising:

a plurality of assembly electrodes extending in one direction;

a dielectric layer to cover the plurality of assembly electrodes; and barrier ribs having a plurality of grooves to accommodate the semiconductor light emitting diodes at the preset positions, the barrier ribs disposed on the dielectric layer, the plurality of grooves arranged in the one direction, wherein one assembly electrode of the plurality of assembly electrodes overlaps with the plurality of grooves arranged in the one direction, and wherein overlap of each of the plurality of grooves arranged in the one direction and the one assembly electrode is half or greater of a total area of each of the plurality of grooves arranged in the one direction.

18. The assembly board of claim 17, wherein the plurality of grooves are disconnected in the one direction.

19. The assembly board of claim 17, wherein only the one assembly electrode overlaps with the plurality of grooves arranged in the one direction.

20. The assembly board of claim 17, further comprising:

a metal shielding layer arranged on the dielectric layer, and intersecting the plurality of grooves arranged in the one direction.

* * * * *